(12) United States Patent
Zeller

(10) Patent No.: US 7,876,153 B1
(45) Date of Patent: Jan. 25, 2011

(54) TRANSCONDUCTOR CIRCUIT

(75) Inventor: Sebastian Zeller, Grassbrunn (DE)

(73) Assignee: STMicroelectronics Design and Application GmbH, Grassbrunn (DE)

(*) Notice: Subject to any disclaimer, the term of this patent is extended or adjusted under 35 U.S.C. 154(b) by 0 days.

(21) Appl. No.: 12/606,374

(22) Filed: Oct. 27, 2009

(51) Int. Cl.
H03F 3/45 (2006.01)

(52) U.S. Cl. .............. 330/252; 330/295; 330/124 R; 330/9

(58) Field of Classification Search .......... 330/252, 330/295, 124 R, 9
See application file for complete search history.

(56) References Cited

U.S. PATENT DOCUMENTS

| | | | |
|---|---|---|---|
| 5,708,391 A * | 1/1998 | Altmann et al. | 330/252 |
| 5,859,606 A * | 1/1999 | Schrader et al. | 341/144 |
| 5,936,465 A * | 8/1999 | Kimura | 330/252 |
| 6,437,630 B1 * | 8/2002 | Gilbert | 327/348 |
| 6,549,057 B1 * | 4/2003 | Gilbert | 327/349 |
| 6,771,124 B1 * | 8/2004 | Ezell | 330/129 |
| 7,443,226 B1 * | 10/2008 | Holloway et al. | 327/513 |

OTHER PUBLICATIONS

Barrie, "The Multi-tanh Principle: A Tutorial Overview," IEEE Journal of Solid-State Circuits, 3(1):2-17, Jan. 1998.

* cited by examiner

Primary Examiner—Patricia Nguyen
(74) Attorney, Agent, or Firm—Lisa K. Jorgenson; E. Russell Tarleton; Seed IP Law Group PLLC

(57) ABSTRACT

A transconductor circuit, particularly according to the multi-tanh principle, having a first input node and a second input node, a first differential amplifier coupled to the first and second input nodes, and having a first offset voltage, and a second differential amplifier coupled to the first and second input nodes, and having a second offset voltage different from the first offset voltage. A first resistance circuit is coupled between the first differential amplifier and at least one current source, and a second resistance circuit is coupled between the second differential amplifier and the at least one current source. Varying of the current sources enables control of the transconductance without degrading linearity.

20 Claims, 3 Drawing Sheets

US 7,876,153 B1

TRANSCONDUCTOR CIRCUIT

BACKGROUND

1. Technical Field

This disclosure relates to a transconductor circuit, particularly according to the multi-tanh design.

2. Description of the Related Art

One approach that has been used for providing a transconductor circuit, particularly according to the so-called multi-tanh principle, is shown in FIG. 1. This transconductor circuit has a first input node INp for receiving a first input signal and a second input node INn for receiving a second input signal of the transconductor circuit. For example, input signals may be received from an antenna for receiving radio frequency signals, which are processed and provided to a tuner such as a tuner for processing broadcasting signals. A first differential amplifier DA1 is coupled to the first and second input nodes INp, INn, and a second differential amplifier DA2 is also coupled to the first and second input nodes INp, INn. The first differential amplifier DA1 has an offset voltage that is different from the offset voltage of the second differential amplifier DA2. The first differential amplifier DA1 includes a transistor T1 and a transistor T2 each having a control node and a controlled path. In the following, where it is referred to a control node, this is the corresponding gate electrode in the case of a MOS transistor or the base node in the case of a bipolar transistor. Further, where it refers to a controlled path, this shall designate the path between the drain and source node in the case of a MOS transistor or the path between the emitter and the collector in case of a bipolar transistor.

The control node of the first transistor T1 is coupled to the first input node INp and the control node of the second transistor T2 is coupled to the second input node INn, wherein the controlled paths of the transistors T1, T2 are coupled with each other to form the differential amplifier DA1. The second differential amplifier DA2 includes a third transistor T3 and a fourth transistor T4, wherein the control node of transistor T3 is coupled to the first input node INp and the control node of the transistor T4 is coupled to the second input node INn. The controlled paths of the transistors T3, T4 are coupled with each other to form the second differential amplifier DA2, as is commonly known. Thus, the transconductor circuit according to FIG. 1 has a set of differential amplifiers or pairs, which particularly utilize transistors of the bipolar type, whose inputs and outputs are connected in parallel. Both differential amplifiers DA1, DA2 share a common current source S via two resistors R having equal magnitude.

The differential amplifier DA1 has an offset voltage that is different from the offset voltage of the differential amplifier DA2. For example, the offset voltages are generated by emitter area ratios A, as shown in FIG. 1. For example, the emitter area of transistor T3 has the magnitude of A, which may be in principle any number different from 1, whereas the emitter area of the transistor T1 has an emitter area with magnitude 1 (being the reference value with respect to emitter area A). For example, the emitter area of transistor T3 may be ten times greater than the emitter area of transistor T1, so that A=10. In the present case, the transistors T1 to T4 are bipolar transistors.

A transconductor circuit of this type and the known multi-tanh principle are described, for example, in: Barrie Gilbert: "The Multi-tanh Principle: A Tutorial Overview", IEEE Journal of Solid-State Circuits, VOL. 33, NO. 1, January 1998, which is included herein by reference.

The ratio of the quiescent voltage drop across the resistors R and the offset voltage needs to be kept constant to maintain the excellent linearity of the structure as shown in FIG. 1. Therefore, the transconductance of this structure cannot be controlled or varied via the bias current source S without degrading its linearity.

BRIEF SUMMARY

In a first aspect, the present disclosure provides a transconductor circuit having a first input node for receiving a first input signal and a second input node for receiving a second input signal, and further including a first differential amplifier coupled to the first and second input nodes, the first differential amplifier having a first offset voltage, and a second differential amplifier coupled to the first and second input nodes, the second differential amplifier having a second offset voltage that is different from the first offset voltage of the first differential amplifier. Respective output paths of the first and second differential amplifiers are connected in parallel. The transconductor circuit further includes a first resistance circuit coupled between the first differential amplifier and at least one current source, and a second resistance circuit coupled between the second differential amplifier and the at least one current source. Each of the first and second resistance circuits includes at least one diode coupled between the respective differential amplifier and the at least one current source in a forward direction. Further, each of the first and second resistance circuits includes a transistor having a controlled path coupled in parallel to the diode. The respective diode includes a first transconductance and the respective transistor is controlled at the control node to provide a second transconductance, wherein the second transconductance is negative with respect to the first transconductance.

According to another aspect, in each of the first and second resistance circuits, the transistor that is parallel-coupled to the diode has its control node cross-coupled to the respective opposite differential amplifier.

According to a further aspect, each of the first and second resistance circuits includes a further transistor that is coupled to form the at least one diode. Therefore, in each of the first and second resistance circuits two transistors are provided with their respective controlled paths connected in parallel, wherein one of the transistors is coupled to form the diode in a forward direction between the respective differential amplifier and the at least one current source.

Therefore, a negative transconductance (also referred to as "gm" in the art, such as in the above mentioned paper "The Multi-tanh Principle" of Barrie Gilbert) is added to a positive transconductance provided by the diode. For example, the effective transconductance of the respective resistance circuit can be adjusted by an emitter area ratio of the transistors provided in the respective resistance circuit.

In accordance with another aspect of the present disclosure, a circuit is provided that includes a first differential amplifier coupled to first and second input nodes and having an offset voltage; a second differential amplifier coupled to the first and second input nodes and having a second offset voltage different from the first offset voltage; and a first resistance circuit coupled between the first differential amplifier and at least one current source, and a second resistance circuit coupled between the second differential amplifier and the at least one current source, the first and second resistance circuits including a first transconductance element and a second transconductance element, and wherein the at least one current source is controllable to control the transconductance of the first and second transconductances without degrading linearity of the circuit.

In accordance with another aspect of the present disclosure, the foregoing circuit includes each of the first and second resistance circuits including at least one diode coupled between the respective differential amplifier and the at least one current source in a forward direction, and further including a transistor having a controlled path coupled in parallel to the diode, wherein the diode includes the first transconductance and the transistor is controlled to provide the second transconductance.

In accordance with another aspect of the foregoing circuit, the first differential amplifier includes a first transistor and a second transistor each having a control node and a controlled path, wherein the control node of the first transistor is coupled to the first input node and the control node of the second transistor is coupled to the second input node, and the controlled paths of the first and second transistors are coupled with each other to form the first differential amplifier; and the second differential amplifier includes a third transistor and a fourth transistor each having a control node and a controlled path, wherein the control node of the third transistor is coupled to the first input node and the control node of the fourth transistor is coupled to the second input node, and the controlled paths of the third and fourth transistors are coupled with each other to form the second differential amplifier.

BRIEF DESCRIPTION OF THE SEVERAL VIEWS OF THE DRAWINGS

The foregoing aspects and other features and advantages of the present disclosure will now be described with reference to the drawings, in which.

DETAILED DESCRIPTION

Figure 1:
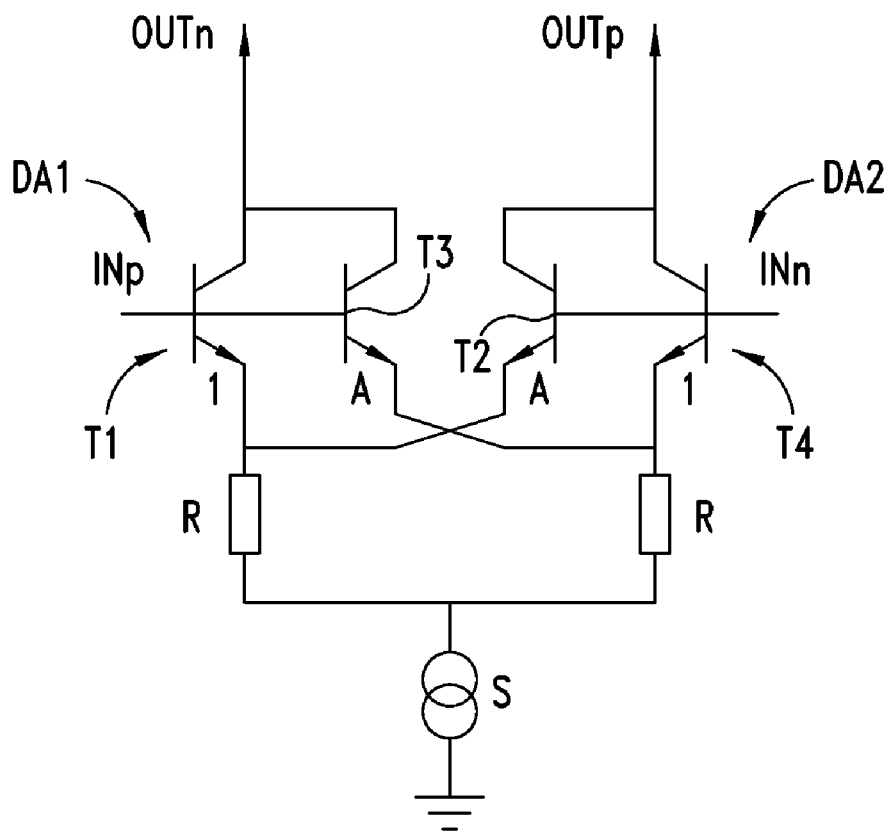
FIG. 1 shows a transconductor circuit according to one approach that has been used.
Figure 2:
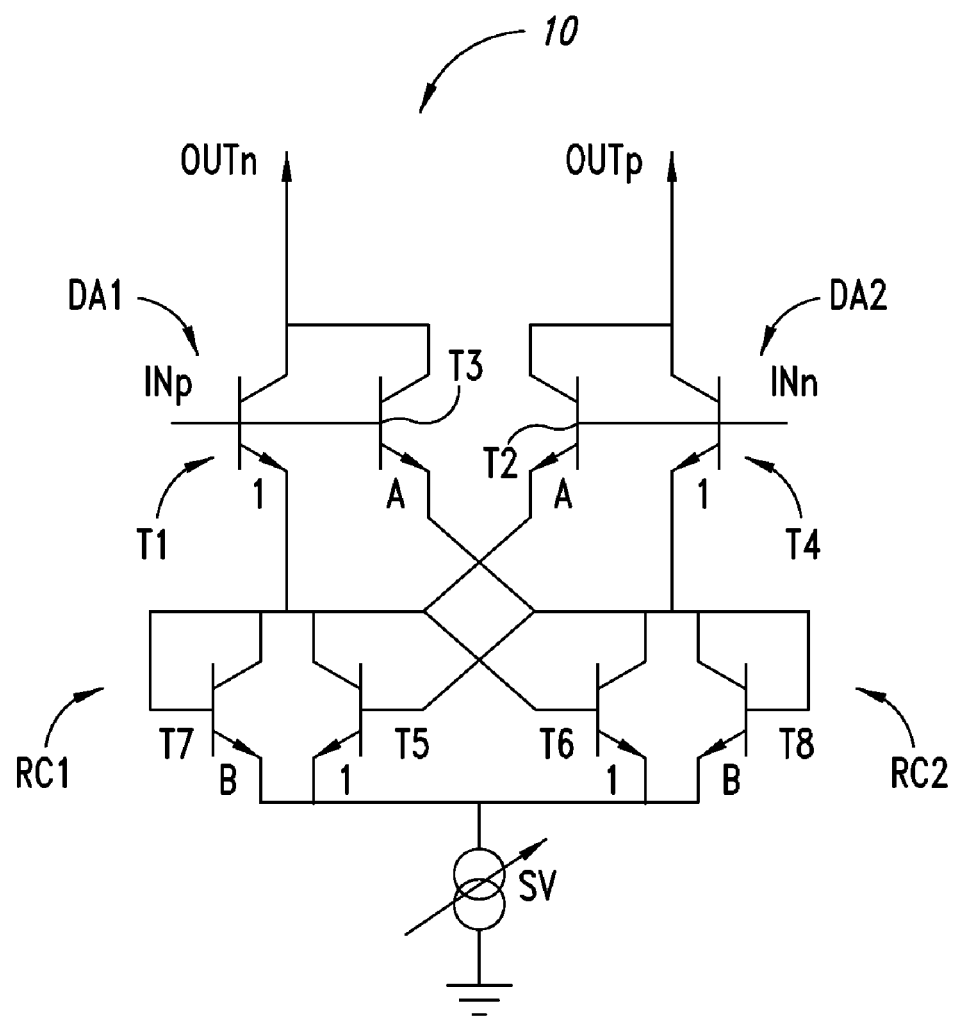
FIG. 2 shows a transconductor circuit according to the present disclosure.

A transconductor circuit formed in accordance with the present disclosure is shown in FIG. 2. Particularly, the transconductor circuit is in the form of a so-called linear hybrid multi-tanh transconductor, which may be used, for example, in a variety of communications applications, such as in tuners for receiving broadcasting or radio frequency signals. It uses a parallel set of differential amplifiers (using, for example, differential pairs of bipolar transistors) whose inputs and outputs are connected in parallel.

The transconductor circuit 10 according to FIG. 2 includes two parallel differential pairs of bipolar transistors with different offset voltages. Particularly, a first differential amplifier DA1 is coupled to a first and second input node INp, INn of the transconductor circuit and has a first offset voltage. A second differential amplifier DA2 is also coupled to the first and second input nodes INp, INn and has a second offset voltage which is different from the first offset voltage. For example, the first and second offset voltages may be opposite offset voltages. Respective output paths of the first and second differential amplifiers DA1, DA2 are connected in parallel for providing a first output signal at a first output node OUTn and a second output signal at a second output node OUTp. The output nodes OUTn, OUTp are common output nodes of both differential amplifiers DA1, DA2.

In the following description, base and gate nodes of bipolar or MOS transistors, respectively, are generally referred to as control nodes, whereas emitter-collector paths and drain-source paths are generally referred to as controlled paths of the respective transistor. The respective conductive types of the transistors used herein are evident from the commonly known symbols used in the Figures. For example, transistors T1-T8 are of the NPN type. Although the following embodiment is described using bipolar transistors, embodiments of the disclosure may, in principle, also be equivalently implemented with MOS transistors, as the skilled person will be aware of.

More particularly, the first differential amplifier DA1 includes a first transistor T1 and a second transistor T2, wherein a control node of the first transistor T1 is coupled to the first input node INp and the control node of the second transistor T2 is coupled to the second input node INn. Respective controlled paths of the first and second transistors T1, T2 are coupled with each other to form the first differential amplifier DA1. Particularly, the emitter nodes of the transistors T1 and T2 are coupled with each other as shown. The second differential amplifier DA2 includes a third transistor T3 and a fourth transistor T4, wherein the control node of the third transistor T3 is coupled to the first input node INp and the control node of the fourth transistor T4 is coupled to the second input node INn, and respective controlled paths of the transistors T3, T4 are coupled with each other to form the second differential amplifier DA2.

The differential amplifier DA1 has a first offset voltage and the differential amplifier DA2 has a second offset voltage that is different from the first offset voltage. For example, as shown in FIG. 2, the first and second offset voltages are generated by a ratio between a first emitter area of transistor T1 included in the differential amplifier DA1 and a second emitter area of the transistor T3 which is included in the differential amplifier DA2. For example, the emitter area of transistor T1 has a reference magnitude of 1, whereas the emitter area of transistor T3 has a magnitude A which is different from 1 and may be, according to a non-limiting example, A=10 so that the emitter area of transistor T3 is ten times greater than the corresponding emitter area of transistor T1. The emitter areas of transistors T2 and T4 may be dimensioned analogously, as shown in FIG. 2. In this way, the differential pairs of the two differential amplifiers have opposite offset voltages. However, according to another embodiment, the respective offset voltages may also be provided by different measures as known to the skilled person.

The controlled paths of the first and second transistors T1, T2 are coupled in parallel to the controlled paths of the third and fourth transistors T3 and T4, respectively, wherein the controlled path of the first transistor T1 is coupled to the controlled path of the third transistor T3 to form a first output node OUTn, and the controlled path of the second transistor T2 is coupled to the controlled path of the fourth transistor T4 to form a second output node OUTp.

A first resistance circuit RC1 is coupled between the first differential amplifier DA1 and at least one current source SV, which may be controllable to provide a variable bias current. A second resistance circuit RC2 is coupled between the second differential amplifier DA2 and the current source SV.

According to the circuit as shown in FIG. 2, the first resistance circuit RC1 includes a fifth transistor T5 having a controlled path coupled between the first differential amplifier DA1 and the current source SV. The transistor T5 further has a control node that is cross-coupled to the opposite differential amplifier DA2, and particularly it is coupled to the controlled paths of the third and fourth transistors T3 and T4. The resistance circuit RC1 further includes a seventh transistor T7 coupled between the differential amplifier DA1 and the current source SV with its controlled path. The transistor T7 is coupled to form a diode which is coupled between the differential amplifier DA1 and the current source SV in a forward direction as shown. The controlled path of the transistor T5 is coupled in parallel to the diode-connected transistor T7 between the differential amplifier DA1 and the current source SV.

The second resistance circuit RC2, analogously, includes a sixth transistor T6 having a controlled path coupled between the second differential amplifier DA2 and the current source SV. A control node of the transistor T6 is cross-coupled to the opposite differential amplifier DA1, particularly is coupled to the controlled paths of the first and second transistors T1 and T2. The resistance circuit RC2 further includes an eighth transistor T8 that is coupled to form a diode coupled in a forward direction between the differential amplifier DA2 and the current source SV, as shown. The controlled path of the transistor T6 is coupled in parallel to the diode-connected transistor T8 between the differential amplifier DA2 and the current source SV.

Thus, in summary, in this embodiment first and second resistance circuits RC1, RC2 are provided between the respective differential amplifier and the current source having two transistors with their controlled paths connected in parallel, wherein one of these two transistors is diode-connected and the other one of the transistors has its base or control node cross-coupled to the emitter nodes of the opposite differential pair. In this way, in each of the resistance circuits RC1, RC2 a negative transconductance (also referred to as "gm" in the art) is added to a positive transconductance. Particularly, the positive transconductance is provided by the diode-connected transistor in forward direction. However, as this transconductance is often too high, a negative transconductance is added to the positive transconductance, the negative transconductance provided by the respective parallel-connected other transistor having its control node cross-coupled to the opposite differential pair. In this way, the effective transconductance between the respective differential pair and the current source can be reduced and adjusted appropriately.

For example, the effective transconductance gm can be adjusted by an emitter area ratio B between transistors T5, T7 and transistors T6, T8, respectively. For example, transistor T5 has an emitter area of magnitude 1 as a reference magnitude, whereas transistor T7 has an emitter area of magnitude B different from 1, so that transistors T5 and T7 have different emitter area magnitudes. The same may be applied analogously for transistors T6 and T8, as shown in FIG. 2.

The linearity of the particular structure of FIG. 2 is only dependent on emitter area ratios. Therefore, the transconductance of the structure can be controlled and varied by the bias current source SV without degrading the linearity of the transconductor circuit.

In the embodiment according to FIG. 2 diode-connected transistors T7 and T8 are used to form the respective diode coupled between the respective differential amplifier and the current source. According to an aspect, for achieving a well defined resistance of the resistance circuit the diode is made particularly from the same or approximately the same diffusions as the respective parallel transistor. Well defined shall mean in this context that the resistance is dependent only on the emitter area ratio and independent on any technological parameter. As will be apparent to the skilled person, when referring to a node, any internal node of an integrated circuit shall be included, for example, when the transconductor circuit is integrated together with other circuits on an integrated circuit chip.

Figure 3:
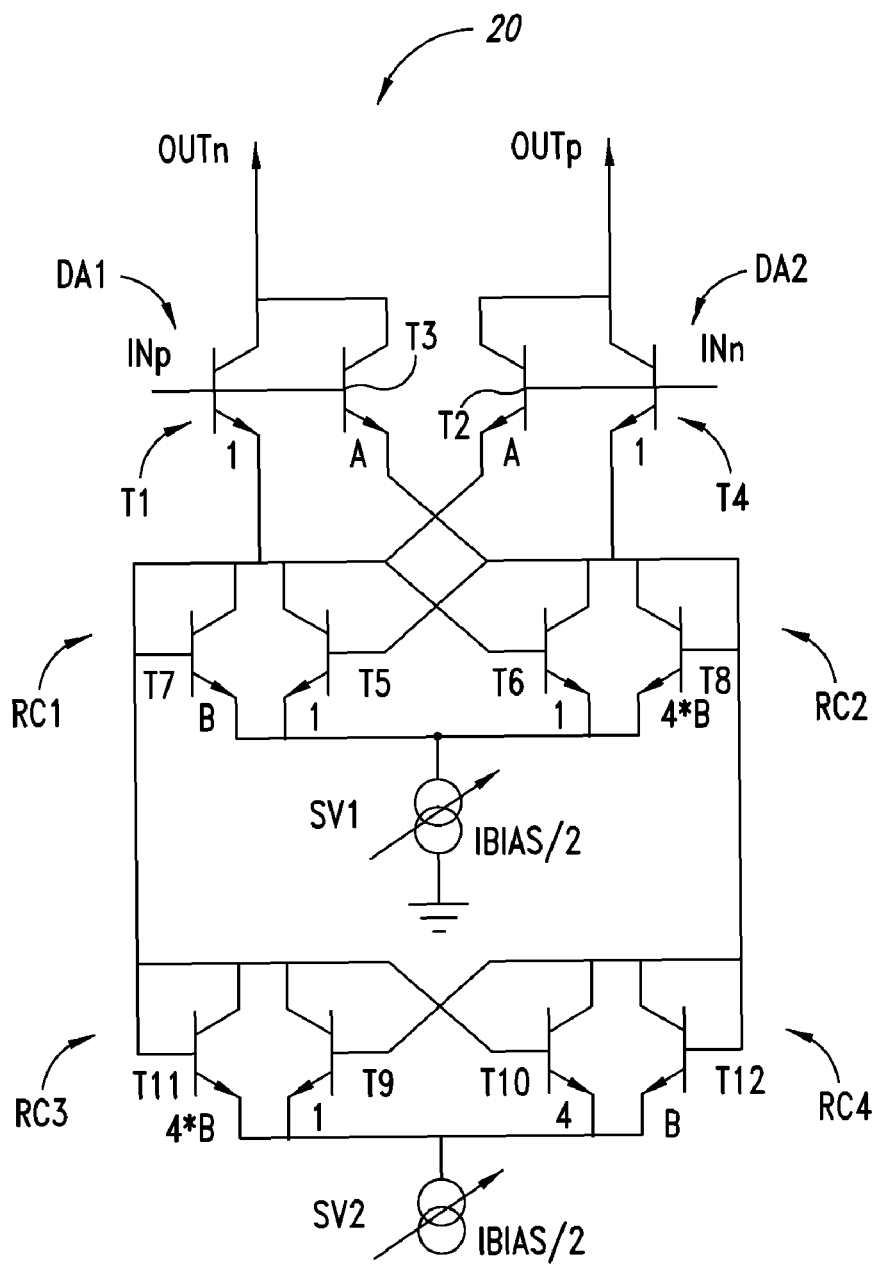
FIG. 3 shows a transconductor circuit according to another aspect of the present disclosure.

Another embodiment of a transconductor circuit in accordance with aspects of the disclosure is shown in FIG. 3. The transconductor circuit 20 according to FIG. 3 includes, in addition to the transconductor circuit of FIG. 2, a third and a fourth resistance circuit RC3 and RC4, wherein resistance circuit RC3 is coupled in parallel to resistance circuit RC1 and resistance circuit RC4 is coupled in parallel to the resistance circuit RC2. The resistance circuit RC3 includes transistors T9 and T11 which are coupled to the differential amplifiers DA1 and DA2 in the same way as transistors T5 and T7, respectively. Likewise, resistance circuit RC4 includes transistors T10 and T12 which are coupled to the differential amplifiers DA1 and DA2 in the same way as transistors T6 and T8, respectively. Instead of current source SV, the resistance circuits RC1, RC2 are coupled to a variable current source SV1 supplying the half bias current $I_{BIAS}/2$ as compared to the bias current provided by current source SV of FIG. 2. Analogously, the resistance circuits RC3, RC4 are coupled to a variable current source SV2 also supplying the half bias current $I_{BIAS}/2$. Transistor T7 has an emitter area of magnitude B, transistor T5 an emitter area of magnitude 4 (four times greater than the reference magnitude 1), transistor T6 an emitter area of magnitude 1, and transistor T8 an emitter area of magnitude 4B (four times greater than the magnitude B). Transistor T11 has an emitter area of magnitude 4B, transistor T9 an emitter area of magnitude 1, transistor T10 an emitter area of magnitude 4, and transistor T12 an emitter area of magnitude B.

According to FIG. 3, the corresponding transistors T7, T12 (diode) and T5, T10 (parallel transistor) of cross-related resistance circuits RC1 and RC4 have the same emitter areas, like in cross-related resistance circuits RC2 and RC3 the corresponding transistors T8, T11 (diode) and T6, T9 (parallel transistor). For large emitter area ratios A in the transistors of differential amplifiers DA1, DA2 the variant of FIG. 3 can give even better linearity.

The various embodiments described above can be combined to provide further embodiments. All of the U.S. patents, U.S. patent application publications, U.S. patent application, foreign patents, foreign patent application and non-patent publications referred to in this specification and/or listed in the Application Data Sheet are incorporated herein by reference, in their entirety. Aspects of the embodiments can be modified, if necessary to employ concepts of the various patents, application and publications to provide yet further embodiments.

While this detailed description has set forth some embodiments of the present disclosure, the appended claims cover also other embodiments of the present disclosure which may differ from the described embodiments according to various modifications and some aspects. For example, the conductive type of transistors may be used as shown or exchanged by the skilled person in another particular transconductor circuit as far as needed and applicable. Further, it is to be understood that the above description is intended to be illustrative and not restrictive. Moreover, in this disclosure terms such as "first", "second", and "third", etc., are used merely as labels, and are not intended to impose numerical requirements on their objects. Other embodiments and modifications within the scope of the claims will be apparent to those of skill in the art upon studying the above description in connection with the drawings. The scope of the disclosure should, therefore, be determined with reference to the appended claims.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A transconductor circuit, comprising:
   a first input node for receiving a first input signal and a second input node for receiving a second input signal;
   a first differential amplifier coupled to the first and second input nodes, and having a first offset voltage; and
   a second differential amplifier coupled to the first and second input nodes, and having a second offset voltage different from the first offset voltage;
   respective output paths of the first and second differential amplifiers that are connected in parallel;
   a first resistance circuit coupled between the first differential amplifier and at least one current source, and a second resistance circuit coupled between the second differential amplifier and the at least one current source; and
   each of the first and second resistance circuits comprising at least one diode coupled between the respective differential amplifier and the at least one current source in a forward direction, and comprising a transistor having a controlled path coupled in parallel to the diode, wherein the diode comprises a first transconductance and the transistor is controlled to provide a second transconductance, and the second transconductance is negative with respect to the first transconductance.

2. The transconductor circuit of claim 1 wherein in each of the first and second resistance circuits a control node of the transistor is cross-coupled to the respective opposite differential amplifier.

3. The transconductor circuit of claim 1 wherein each of the first and second resistance circuits comprises a further transistor that is coupled to form the at least one diode.

4. The transconductor circuit of claim 1 wherein the first and second offset voltages are generated by a ratio between a first emitter area of at least one transistor included in the first differential amplifier and a second emitter area of at least another transistor included in the second differential amplifier.

5. The transconductor circuit of claim 1 wherein:
   the first differential amplifier comprises a first transistor and a second transistor each having a control node and a controlled path, wherein the control node of the first transistor is coupled to the first input node and the control node of the second transistor is coupled to the second input node, and the controlled paths of the first and second transistors are coupled with each other to form the first differential amplifier; and
   the second differential amplifier comprises a third transistor and a fourth transistor each having a control node and a controlled path, wherein the control node of the third transistor is coupled to the first input node and the control node of the fourth transistor is coupled to the second input node, and the controlled paths of the third and fourth transistors are coupled with each other to form the second differential amplifier.

6. The transconductor circuit of claim 5 wherein the transistor of the first resistance circuit is a fifth transistor, and the control node of the fifth transistor is coupled to the controlled paths of the third and fourth transistors.

7. The transconductor circuit of claim 5 wherein the transistor of the second resistance circuit is a sixth transistor, and the control node of the sixth transistor is coupled to the controlled paths of the first and second transistors.

8. The transconductor circuit of claim 1 wherein the transistor of the first resistance circuit is a fifth transistor, and the first resistance circuit further comprises a seventh transistor that is coupled to form the at least one diode, the fifth and seventh transistors having different emitter area magnitudes.

9. The transconductor circuit of claim 1 wherein the transistor of the second resistance circuit is a sixth transistor, and the second resistance circuit further comprises an eighth transistor that is coupled to form the at least one diode, the sixth and eighth transistors having different emitter area magnitudes.

10. The transconductor circuit of claim 1, further comprising:
    a third resistance circuit coupled to the first differential amplifier in parallel to the first resistance circuit;
    a fourth resistance circuit coupled to the second differential amplifier in parallel to the second resistance circuit;
    wherein the first and second resistance circuits are coupled to the at least one current source, which is configured to provide half of a bias current for the differential amplifiers, and the third and fourth resistance circuits are coupled to at least another current source, which is configured to provide half of the bias current for the differential amplifiers.

11. A transconductor circuit, comprising:
    a first input node for receiving a first input signal and a second input node for receiving a second input signal;
    a first differential amplifier comprising a first transistor and a second transistor, wherein a control node of the first transistor is coupled to the first input node and a control node of the second transistor is coupled to the second input node, and respective controlled paths of the first and second transistors are coupled with each other to form the first differential amplifier, the first differential amplifier having a first offset voltage; and
    a second differential amplifier comprising a third transistor and a fourth transistor, wherein a control node of the third transistor is coupled to the first input node and a control node of the fourth transistor is coupled to the second input node, and respective controlled paths of the third and fourth transistors are coupled with each other to form the second differential amplifier, the second differential amplifier having a second offset voltage different from the first offset voltage;
    the controlled paths of the first and second transistors are coupled in parallel to the controlled paths of the third and fourth transistors, respectively;
    a first resistance circuit coupled between the first differential amplifier and at least one current source, and a second resistance circuit coupled between the second differential amplifier and the at least one current source;
    the first resistance circuit comprising a fifth transistor having a control node coupled to the controlled paths of the third and fourth transistors, and the second resistance circuit comprising a sixth transistor having a control node coupled to the controlled paths of the first and second transistors;
    the first resistance circuit further comprising a seventh transistor that is coupled to form at least one first diode and coupled between the first differential amplifier and the current source in a forward direction, and the fifth transistor having a controlled path coupled in parallel to the first diode, and the second resistance circuit further comprising an eighth transistor that is coupled to form at least one second diode and coupled between the second differential amplifier and the current source in a forward direction, and the sixth transistor having a controlled path coupled in parallel to the second diode.

12. The transconductor circuit of claim 11, comprising a second resistance circuit and a fourth resistance circuit, the third resistance circuit coupled to the first differential amplifier in parallel to the first resistance circuit, and the fourth resistance circuit coupled to the second differential amplifier in parallel to the second resistance circuit, the first and second resistance circuits coupled to the at least one current source, which is configured to provide half of a bias current for the differential amplifiers, and the third and fourth resistance circuits coupled to at least another current source that is configured to provide half of the bias current for the differential amplifiers of the third and fourth resistance circuits.

13. The transconductor circuit of claim 12 wherein each of the third and fourth resistance circuits comprises at least one diode coupled between the respective differential amplifier and the at least another current source in a forward direction, and comprising a transistor having a controlled path coupled in parallel to the diode, wherein the diode comprises a third transconductance and the transistor is controlled to provide a fourth transconductance, and the fourth transconductance is negative with respect to the third transconductance.

14. A circuit, comprising:
a first differential amplifier coupled to first and second input nodes and having an offset voltage;
a second differential amplifier coupled to the first and second input nodes and having a second offset voltage different from the first offset voltage; and
a first resistance circuit coupled between the first differential amplifier and at least one current source, and a second resistance circuit coupled between the second differential amplifier and the at least one current source, the first and second resistance circuits comprising a first transconductance element and a second transconductance element, and wherein the at least one current source is controllable to control the transconductance of the first and second transconductances without degrading linearity of the circuit.

15. The circuit of claim 14 wherein each of the first and second resistance circuits comprises at least one diode coupled between the respective differential amplifier and the at least one current source in a forward direction, and further comprises a transistor having a controlled path coupled in parallel to the diode, wherein the diode comprises the first transconductance and the transistor is controlled to provide the second transconductance.

16. The circuit of claim 14 wherein:
the first differential amplifier comprises a first transistor and a second transistor each having a control node and a controlled path, wherein the control node of the first transistor is coupled to the first input node and the control node of the second transistor is coupled to the second input node, and the controlled paths of the first and second transistors are coupled with each other to form the first differential amplifier; and
the second differential amplifier comprises a third transistor and a fourth transistor each having a control node and a controlled path, wherein the control node of the third transistor is coupled to the first input node and the control node of the fourth transistor is coupled to the second input node, and the controlled paths of the third and fourth transistors are coupled with each other to form the second differential amplifier.

17. The circuit of claim 14, further comprising:
a third resistance circuit coupled to the first differential amplifier in parallel to the first resistance circuit;
a fourth resistance circuit coupled to the second differential amplifier in parallel to the second resistance circuit; and
wherein the first and second resistance circuits are coupled to the at least one current source, which is configured to provide half of a bias current for the differential amplifiers, and the third and fourth resistance circuits are coupled to at least another current source, which is configured to provide half of the bias current for the differential amplifiers.

18. The circuit of claim 14 wherein
the transistor of the first resistance circuit is a fifth transistor, and the first resistance circuit further comprises a seventh transistor that is coupled to form the at least one diode, the fifth and seventh transistors having different emitter area magnitudes; and
the transistor of the second resistance circuit is a sixth transistor, and the second resistance circuit further comprises an eighth transistor that is coupled to form the at least one diode, the sixth and eighth transistors having different emitter area magnitudes.

19. The circuit of claim 14 wherein the first and second offset voltages are generated by a ratio between a first emitter area of at least one transistor included in the first differential amplifier and a second emitter area of at least another transistor included in the second differential amplifier.

20. The circuit of claim 14 wherein:
in each of the first and second resistance circuits a control node of the transistor is cross-coupled to the respective opposite differential amplifier; and
each of the first and second resistance circuits comprises a further transistor that is coupled to form the at least one diode.

* * * * *